(12) United States Patent
Lee et al.

(10) Patent No.: US 10,818,227 B2
(45) Date of Patent: Oct. 27, 2020

(54) DISPLAY DEVICE CAPABLE OF DISCHARGING STATIC ELECTRICITY AND SENSING STRESS OR TEMPERATURE OF A SUBSTRATE THEREOF

(71) Applicant: SAMSUNG DISPLAY CO., LTD., Yongin-si, Gyeonggi-Do (KR)

(72) Inventors: Jinwoo Lee, Suwon-si (KR); Kiwan Ahn, Seoul (KR); Jintaek Kim, Yongin-si (KR); Jaehyuk Jang, Seongnam-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 71 days.

(21) Appl. No.: 16/202,687

(22) Filed: Nov. 28, 2018

(65) Prior Publication Data

US 2019/0164487 A1 May 30, 2019

(30) Foreign Application Priority Data

Nov. 28, 2017 (KR) ........................ 10-2017-0160770

(51) Int. Cl.
*G09G 3/3233* (2016.01)
*H01L 27/02* (2006.01)
(Continued)

(52) U.S. Cl.
CPC ....... *G09G 3/3233* (2013.01); *H01L 27/0248* (2013.01); *H01L 27/0288* (2013.01); *H01L 27/12* (2013.01); *H01L 27/1218* (2013.01); *H01L 27/1255* (2013.01); *H01L 27/326* (2013.01); *H01L 27/3225* (2013.01); *H01L 27/3276* (2013.01); *H01L 51/0097* (2013.01); *H01L 51/5253* (2013.01); *G09G 3/006* (2013.01); *G09G 2310/08* (2013.01); *G09G 2320/0223* (2013.01);
(Continued)

(58) Field of Classification Search
CPC ................. G09G 3/3233; G09G 3/006; G09G 2320/0223; G09G 2320/041; H01L 27/0248; H01L 27/0288; H01L 27/12; H01L 27/1218; H01L 27/1255; H01L 27/3225; H01L 27/326; H01L 27/3276; H01L 51/0097; H01L 51/5253
See application file for complete search history.

(56) References Cited

U.S. PATENT DOCUMENTS 8,525,799 B1 * 9/2013 Grivna ................. G06F 3/0416
345/173
9,377,371 B2 6/2016 Nguyen et al.
(Continued)

FOREIGN PATENT DOCUMENTS

| KR | 10-2015-0082751 | 7/2015 |
| KR | 10-2016-0084549 | 7/2016 |
| KR | 10-2017-0037786 | 4/2017 |

*Primary Examiner* — Michael Pervan
(74) *Attorney, Agent, or Firm* — F. Chau & Associates, LLC

(57) ABSTRACT

A display device includes a substrate including a first substrate layer which is flexible, a second substrate layer which is flexible, and a conductive layer between the first substrate layer and the second substrate layer, a display panel including a plurality of transistors disposed on the substrate, and a sensing portion configured to measure a resistance of the conductive layer.

20 Claims, 8 Drawing Sheets

(51) Int. Cl.
*H01L 51/00* (2006.01)
*H01L 51/52* (2006.01)
*H01L 27/32* (2006.01)
*H01L 27/12* (2006.01)
*G09G 3/00* (2006.01)

(52) U.S. Cl.
CPC . *G09G 2320/041* (2013.01); *G09G 2330/021* (2013.01); *G09G 2330/12* (2013.01); *G09G 2380/02* (2013.01); *H01L 27/3244* (2013.01); *H01L 27/3246* (2013.01); *H01L 2251/556* (2013.01)

(56) References Cited

U.S. PATENT DOCUMENTS

| | | |
|---|---|---|
| 9,666,657 B2 | 5/2017 | Cho |
| 2016/0299530 A1* | 10/2016 | Zhang ................. H01L 27/1218 |
| 2017/0092709 A1 | 3/2017 | Choi et al. |
| 2017/0104051 A1 | 4/2017 | Gai et al. |
| 2018/0196554 A1* | 7/2018 | Ishizaki ................. G06F 3/047 |
| 2018/0252955 A1* | 9/2018 | Kurasawa ............. G06F 3/0412 |

* cited by examiner

DISPLAY DEVICE CAPABLE OF DISCHARGING STATIC ELECTRICITY AND SENSING STRESS OR TEMPERATURE OF A SUBSTRATE THEREOF

CROSS-REFERENCE TO RELATED APPLICATION

This application claims priority under 35 U.S.C. § 119 to Korean Patent Application No. 10-2017-0160770, filed on Nov. 28, 2017 in the Korean Intellectual Property Office (KIPO), the disclosure of which is incorporated by reference herein in its entirety.

TECHNICAL FIELD

Exemplary embodiments of the inventive concept relate to a display device, and more particularly, to a flexible display device capable of discharging static electricity generated on a substrate and sensing the stress or temperature of the substrate

DISCUSSION OF RELATED ART

Examples of display devices include liquid crystal display (LCD) devices, plasma display panel (PDP) display devices, and organic light emitting diode (OLED) display devices. In particular, LCD devices and OLED display devices may be developed as flexible display devices.

To increase flexibility of a flexible display device, a plastic film such as a polyimide film may be used as a substrate for the flexible display device. In such a case, due to its flexibility, the plastic film is attached to a glass substrate for supporting the plastic film during the manufacturing process of the flexible display device, and after the manufacturing process is completed, the glass substrate is separated from the plastic film by laser. A protective film may be attached to the plastic film, from which the glass substrate has been detached, through a lamination process.

However, in the process of separating the glass substrate from the plastic film and attaching the protective film to the plastic film from which the glass substrate is detached, static electricity may be generated. In addition, static electricity may also be generated by equipment or human contact during a module process. However, when a discharging path for the static electricity is not present in the flexible display device and the plastic film has a high dielectric constant, static electricity may remain in the plastic film.

In addition, the stress caused by a folding and unfolding operation of the substrate during the manufacturing process of the display device or a temperature change of the substrate may affect luminance of the display device.

SUMMARY

According to an exemplary embodiment of the inventive concept, a display device includes a substrate including a first substrate layer which is flexible, a second substrate layer which is flexible, and a conductive layer between the first substrate layer and the second substrate layer, a display panel including a plurality of transistors disposed on the substrate, and a sensing portion configured to measure a resistance of the conductive layer.

The display panel may further include a barrier layer disposed between the first substrate layer and the second substrate layer.

The conductive layer may have one of a parallel straight line pattern, a mesh-like pattern, a honeycomb-like pattern, a spring-like pattern, or a zigzag pattern.

The conductive layer may have a plurality of areas separated from one another, and the sensing portion may measure a resistance of each of the plurality of areas.

The substrate may be bendable in a first direction, the plurality of areas may be arranged in the first direction, and each of the plurality of areas may extend in a second direction which is perpendicular to the first direction.

The plurality of areas may include at least three areas.

The display device may further include a ground electrode disposed on the substrate, and configured to receive a ground voltage. The conductive layer may be connected to the ground electrode through a first contact hole which passes through the second substrate layer.

The display device may further include a sensing electrode disposed on the substrate, configured to receive a sensing power, and connected to the sensing portion. The conductive layer may be connected to the sensing electrode through a second contact hole which passes through the second substrate layer.

The first contact hole and the second contact hole may be located at respective side edges of the display panel opposite to each other in the second direction.

The display device may further include a data driver configured to apply data signal voltages to pixels disposed in the display panel and overlapping the plurality of areas, and a compensating portion configured to compensate for the data signal voltages applied to the pixels based on the resistances of the plurality of areas measured by the sensing portion.

The display device may further include a data driver configured to apply a data signal voltage to pixels disposed in the display panel, and a compensating portion configured to compensate for the data signal voltage based on a resistance of the conductive layer measured by the sensing portion.

The display device may further include a power supply portion configured to apply a power voltage to pixels disposed in the display panel, and a compensating portion configured to compensate for the power voltage based on a resistance of the conductive layer measured by the sensing portion.

The conductive layer may have a variable resistance which varies in accordance with deformation of the substrate.

The conductive layer may have a variable resistance which varies depending on a temperature of the substrate.

According to an exemplary embodiment of the inventive concept, a display device includes a substrate including a first substrate layer which is flexible, a buffer layer, and a conductive layer between the first substrate layer and the buffer layer, a display panel including a plurality of transistors disposed on the buffer layer, and a sensing portion configured to measure a variation of a resistance of the conductive layer.

The substrate may further include a barrier layer disposed between the first substrate layer and the buffer layer, and a second substrate layer disposed between the barrier layer and the buffer layer.

According to an exemplary embodiment of the inventive concept, a display device includes a first substrate which is flexible, a second substrate which is flexible, a conductive layer between the first substrate and the second substrate, a plurality of transistors on the second substrate, and a sensing electrode connected to the conductive layer, and configured to receive one of a predetermined voltage signal and a predetermined current signal and output one of a voltage signal and a current signal which are determined based on a resistance of the conductive layer.

The display device may further include a ground electrode disposed on the second substrate, connected to the conductive layer, and configured to receive a ground voltage.

The sensing electrode and the ground electrode may be disposed on the second substrate and be connected to the conductive layer through a contact hole which passes through the second substrate.

The conductive layer may have one of a parallel straight line pattern, a mesh-like pattern, a honeycomb-like pattern, a spring-like pattern, or a zigzag pattern.

BRIEF DESCRIPTION OF THE DRAWINGS

The above and other features of the inventive concept will become more apparent by describing in detail exemplary embodiments thereof with reference to the accompanying drawings.

DETAILED DESCRIPTION OF THE EMBODIMENTS

Figure 1:
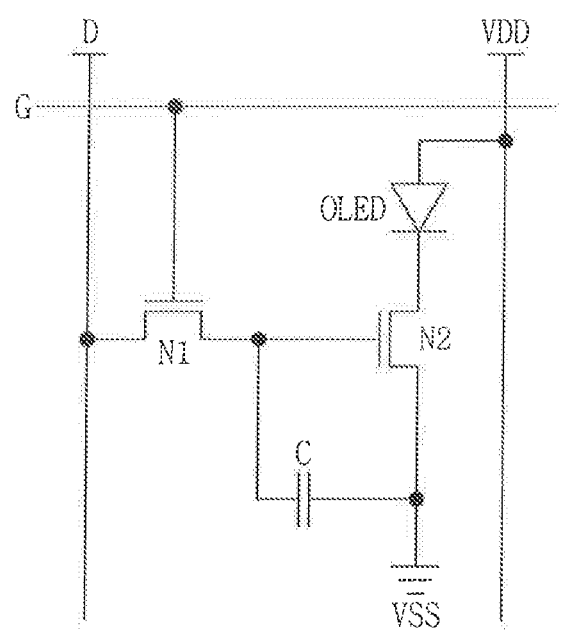
FIG. 1 is an equivalent circuit diagram illustrating a pixel of a display device according to an exemplary embodiment of the inventive concept.

Exemplary embodiments of the inventive concept are directed to a display device capable of discharging static electricity generated on a substrate and sensing stress or temperature of the substrate.

Exemplary embodiments of the inventive concept will now be described more fully hereinafter with reference to the accompanying drawings. Like reference numerals may refer to like elements throughout this application.

In the drawings, thicknesses of layers and areas are illustrated in an enlarged manner for clarity and ease of description thereof. When a layer, area, or plate is referred to as being "on" another layer, area, or plate, it may be directly on the other layer, area, or plate, or intervening layers, areas, or plates may be present therebetween. Conversely, when a layer, area, or plate is referred to as being "directly on" another layer, area, or plate, intervening layers, areas, or plates may be absent therebetween.

Throughout the specification, when an element is referred to as being "connected" to another element, the element is "directly connected" to the other element, or "electrically connected" to the other element with one or more intervening elements interposed therebetween.

FIG. 1 is an equivalent circuit diagram illustrating a pixel of a display device according to an exemplary embodiment of the inventive concept.

Referring to FIG. 1, a pixel of a display device includes a switching transistor N1, a capacitor C, a driving transistor N2, and an organic light emitting diode OLED between a gate line G and a data line D. Herein, each of the transistors N1 and N2 may be a thin film transistor (TFT) including or formed of amorphous silicon (a-Si: H), or a TFT including or formed of indium (In), gallium (Ga), zinc (Zn), tin (Sn), titanium (Ti), or the like.

A gate electrode of the switching transistor N1 is connected to the gate line G, and a source electrode of the switching transistor N1 is connected to the data line D. One side of the capacitor C is connected to a drain electrode of the switching transistor N1, and another side of the capacitor C is grounded (GND) (e.g., connected to a low potential driving voltage VSS) along with a source electrode of the driving transistor N2.

A drain electrode of the driving transistor N2 is connected to a cathode electrode of the OLED to which a driving voltage VDD (also referred to as a high potential driving voltage VDD) is applied, a gate electrode of the driving transistor N2 is connected to the drain electrode of the switching transistor N1, and the source electrode of the driving transistor N2 is grounded (GND).

In addition, the switching transistor N1 is turned on in response to a gate signal applied from the gate line G to conduct a current between the source electrode and the drain electrode of the switching transistor N1. A data signal voltage applied from the data line D during a turn-on period of the switching transistor N1 is applied to the gate electrode of the driving transistor N2 and the capacitor C via the source electrode and the drain electrode of the switching transistor N1.

The driving transistor N2 controls a current flowing in the OLED according to the data signal voltage applied to the gate electrode of the driving transistor N2. Further, the capacitor C stores a data voltage and then maintains the data voltage constant for one frame period of the display device.

Figure 2:
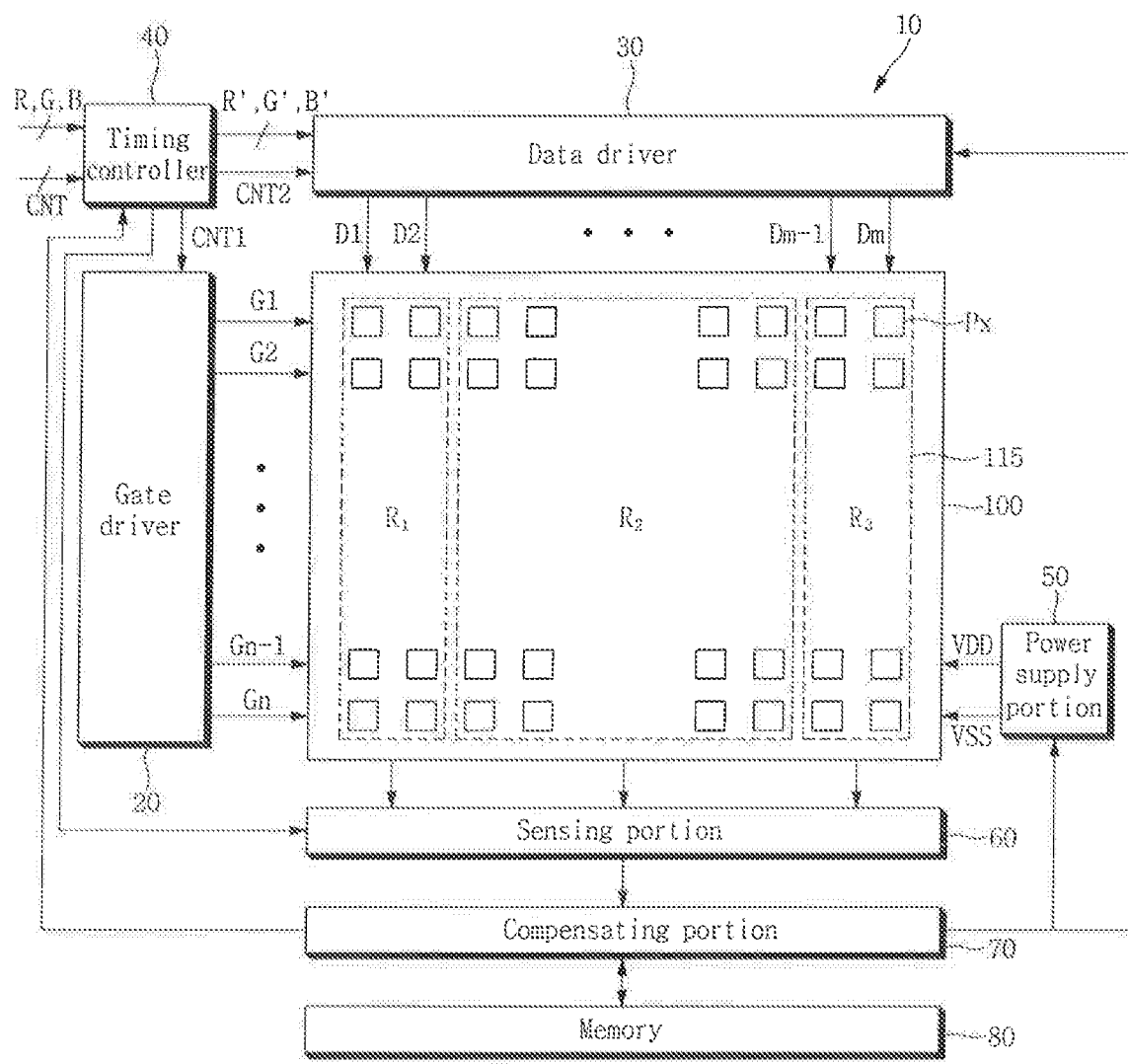
FIG. 2 is a circuit configuration view illustrating a display device according to an exemplary embodiment of the inventive concept.

FIG. 2 is a circuit configuration view illustrating a display device according to an exemplary embodiment of the inventive concept.

Referring to FIG. 2, a display device 10 may include a display panel 100, a gate driver 20, a data driver 30, a timing controller 40, a power supply portion 50, a sensing portion 60, a compensating portion 70, and a memory 80.

A plurality of gate lines G1 to Gn and a plurality of data lines D1 to Dm which intersect one another to define a pixel area Px formed on the display panel 100.

In addition, a switching TFT, a driving TFT, a capacitor, and an OLED may be include in each of pixels in the pixel area Px, as illustrated in FIG. 1.

Pixels of red R, green G, and blue B may be disposed in the pixel area Px of the display panel 100. The pixels may be arranged in a grid pattern or in a stripe form. A detailed description of the structure of the display panel 100 will be provided below.

The gate driver 20 may generate a gate signal based on a gate control signal CNT1 provided from the timing controller 40 and sequentially apply the gate signal to the plurality of gate lines G1 to Gn of the display panel 100.

The data driver 30 may generate a data signal voltage using image data R', G', and B' and a data control signal CNT2 provided from the timing controller 40 and apply the data signal voltage to the plurality of data lines D1 to Dm of the display panel 100.

The timing controller 40 may receive image data R, G, and B and a control signal CNT, and may generate the gate control signal CNT1 and the data control signal CNT2 for controlling the operation of the gate driver 202 and the data driver 30, respectively, based on the control signal CNT provided from the outside, e.g., a vertical synchronization signal, a horizontal synchronization signal, a clock signal, a data enable signal or the like. The generated gate control signal CNT1 and the generated data control signal CNT2 may be output to the gate driver 20 and the data driver 30, respectively.

The power supply portion 50 applies the high potential driving voltage VDD and the low potential driving voltage VSS to each pixel in the pixel area PX.

The sensing portion 60 measures a resistance of a conductive layer 115 included in the display panel 100 and outputs the measured resistance value to the compensating portion 70. The conductive layer 115 may be divided into a plurality of areas R1, R2, and R3, which will be described in detail below.

The compensating portion 70 outputs a compensation value corresponding to the resistance value received from the sensing portion 60. The compensation value may be values for compensating for the high potential driving voltage VDD and the low potential driving voltage VSS applied from the power supply portion 50, the data signal voltage output from the data driver 30, and the image data R', G', and B' output from the timing controller 40.

The memory 80 stores a look-up table containing the compensation values corresponding to the measured resistance values, and the compensating portion 70 may output the compensation value corresponding to the measured resistance value from the table stored in the memory 80.

The operation of the sensing portion 60, the compensating portion 70, and the memory 80 will be described below in detail.

Figure 3:
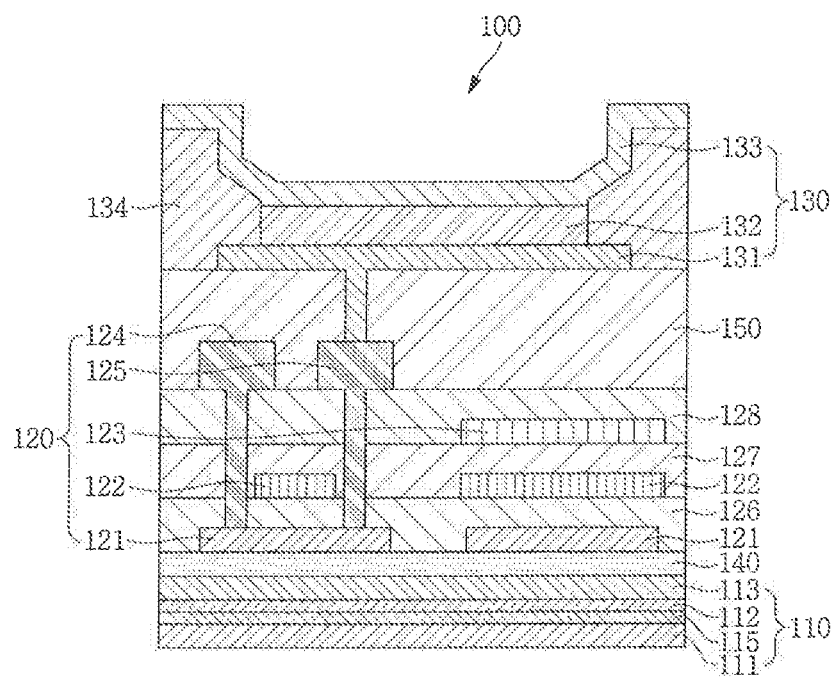
FIG. 3 is a cross-sectional view illustrating a part of a pixel included in a display panel of FIG. 2 according to an exemplary embodiment of the inventive concept.

FIG. 3 is a cross-sectional view illustrating a part of a pixel included in a display panel of FIG. 2 according to an exemplary embodiment of the inventive concept.

As illustrated in FIG. 3, the display panel 100 according to an exemplary embodiment of the inventive concept includes a substrate 110, a transistor 120, and an organic light emitting layer 132.

The substrate 110 according to an exemplary embodiment of the inventive concept includes a first substrate layer 111, a second substrate layer 113, and the conductive layer 115. The first substrate layer 111 and the second substrate layer 113 may include or be formed of a flexible and electrically insulating material. The first substrate layer 111 and the second substrate layer 113 may be formed to include a substantially same material and/or have a substantially equal thickness. However, the inventive concept is not limited thereto, and the first substrate layer 111 and the second substrate layer 113 may include different materials and may have different thicknesses.

The first substrate layer 111 and the second substrate layer 113 according to an exemplary embodiment of the inventive concept may include or be formed of a polymer resin, such as polyimide or polyethylene terephthalate, or a flexible ceramic. However, the inventive concept is not limited thereto, and the substrate 110 may include any material having transparency, flexibility, and electrically insulating properties.

As illustrated in FIG. 3, the conductive layer 115 having electric conductivity may be formed between the first substrate layer 111 and the second substrate layer 113, which have electrically insulating properties. The kind of the conductive layer 115 according to an exemplary embodiment of the inventive concept is not limited as long as the conductive layer 115 includes a material having electric conductivity. However, since the conductive layer 115 according to an exemplary embodiment of the inventive concept is applied to the display panel 100 that is flexible, the conductive layer 115 between the first substrate layer 111 and the second substrate layer 113 should have physical properties such that it does not hinder the performance of the display panel 100 while a folding and unfolding operation of the display panel 100 is repeated.

When the conductive layer 115 according to an exemplary embodiment of the inventive concept includes a metal, it may be formed to include a metal substantially the same as a metal used in the process of manufacturing the display panel 100.

On the other hand, when the conductive layer 115 according to an exemplary embodiment of the inventive concept includes a conductive polymer, it may include a synthetic resin polymer such as polyethylene dioxythiophene (poly(3, 4-ethylenedioxythiophene)) (PEDOT), a derivative of PEDOT, or a combination thereof. However, the inventive concept is not limited thereto, and the conductive layer 115 may include a conductive polymer, such as carbon nanotubes or graphene, a derivative of carbon nanotubes or graphene, or a combination of these materials.

The conductive layer 115 according to an exemplary embodiment of the inventive concept may include a material whose resistance changes in accordance with the intensity of a stress that is generated when the display panel 100 is bent. The conductive layer 115 may include, for example, piezoelectric materials, carbon powder, quantum tunneling composite (QTC), silver nanoparticles, monocrystalline or polycrystalline silicon, carbon nanotubes, graphene, or the like. However, the inventive concept is not limited thereto, and the resistance of the conductive layer 115 may not change although the display panel 100 is bent.

In addition, the resistance of the conductive layer 115 according to an exemplary embodiment of the inventive concept may vary depending on the temperature. For example, the resistance of the conductive layer 115 may increase as the temperature rises (e.g., has a positive temperature coefficient), similar to most metals.

On the other hand, the conductive layer 115 according to an exemplary embodiment of the inventive concept may have a negative temperature coefficient, similar to most semiconductors that include carbon, germanium, or silicon. The conductive layer 115 according to an exemplary embodiment of the inventive concept may have a temperature coefficient of substantially zero.

The conductive layer 115 according to an exemplary embodiment of the inventive concept may be formed by entirely covering one surface of the first substrate layer 111 in a coating or depositing method, similar to other layers that are formed on the display panel 100, but the inventive concept is not limited thereto. The conductive layer 115 may have various shapes of patterns and may be divided into a plurality of areas, which will be described in detail below.

The substrate 110 according to an exemplary embodiment of the inventive concept may further include a barrier layer 112. The barrier layer 112 may be formed on the first substrate layer 111. The barrier layer 112 may include an inorganic material. For example, the barrier layer 112 may include a material including silicon, such as amorphous silicon, silicon oxide, or silicon nitride.

The barrier layer 112 is formed on the first substrate layer 111, which is susceptible to air and moisture, so as to substantially prevent breakage of the first substrate layer 111 and the second substrate layer 113, and to substantially prevent undesirable elements such as air and moisture from penetrating into the display panel 100.

In an exemplary embodiment of the inventive concept, although the barrier layer 112 is depicted in FIG. 3 as being disposed between the first substrate layer 111 and the conductive layer 115, the inventive concept is not limited thereto. For example, the barrier layer 112 may be disposed between the conductive layer 115 and the second substrate layer 113, or may not be provided at all.

The transistor 120 is formed on the substrate 110 according to an exemplary embodiment of the inventive concept. The transistor 120 includes a semiconductor layer 121 which is formed on the substrate 110, a first gate electrode 122 which is formed at a position corresponding to the semiconductor layer 121, and a source electrode 124 and a drain electrode 125 which are connected to the semiconductor layer 121 through a contact hole. In the present exemplary embodiment, the transistor 120 may further include a second gate electrode 123 formed on a layer different from a layer on which the first gate electrode 122 is disposed. The aforementioned electrodes may all have electric conductivity.

The conductive layer 115 may include or be formed of a metal forming the gate electrode, the source electrode 124, and the drain electrode 125 of the transistor 120. It would be more economical for the conductive layer 115 to include or be formed of the metal used to form the transistor 120, and furthermore, a difference between physical properties of each layer may be reduced. Accordingly, it is possible to further prevent damage to the product such as accumulation of fatigue which may be caused by repeating the folding and unfolding operation of the flexible display panel 100.

An electrically insulating layer is formed between the semiconductor layer 121 and the first gate electrode 122, between the first gate electrode 122 and the second gate electrode 123, between the second gate electrode 123 and the source electrode 124, and between the second gate electrode 123 and the drain electrode 125, thus substantially preventing electrical contact between each electrodes. For example, a first gate insulating layer 126 is formed between the semiconductor layer 121 and the first gate electrode 122, a second gate insulating layer 127 is formed between the first gate electrode 122 and the second gate electrode 123, and an insulating interlayer 128 is formed between the second gate electrode 123 and the source electrode 124 and between the second gate electrode 123 and the drain electrode 125, and thus a short circuit which may be caused by contact between each electrode may be substantially prevented.

According to an exemplary embodiment of the inventive concept, a buffer layer 140 may be further formed between the substrate 110 and the transistor 120. The buffer layer 140, similar to the barrier layer 112, may substantially prevent undesirable elements from penetrating into the display panel 100 and interfering with the operation of the transistor 120.

The conductive layer 115 according to an exemplary embodiment of the inventive concept may be formed between the first substrate layer 111 and the second substrate layer 113 as illustrated in FIG. 3, but the inventive concept is not limited thereto. An exemplary embodiment of the inventive concept in which the position of the conductive layer 115 is different will be described with reference to FIG. 4.

Figure 4:
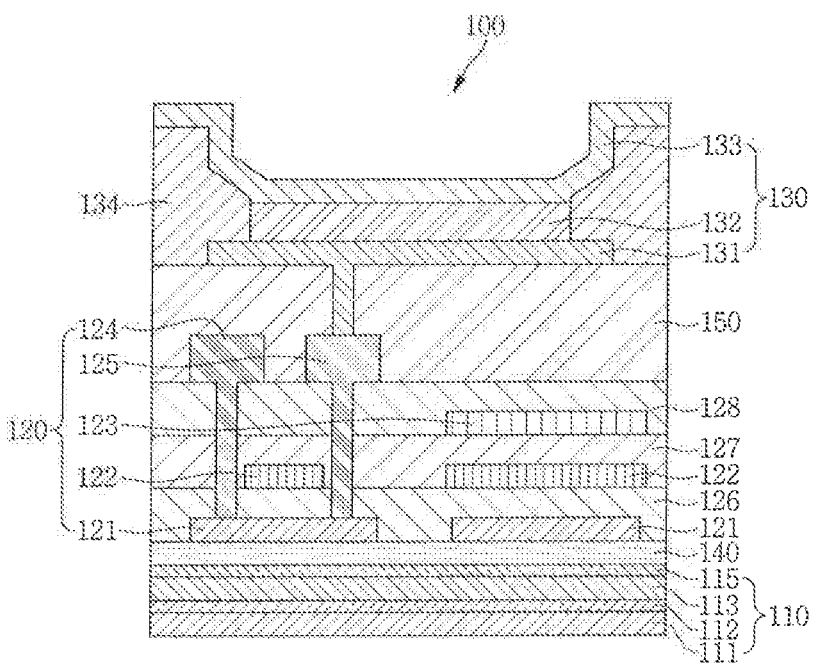
FIG. 4 is a cross-sectional view illustrating a part of a pixel included in a display panel of FIG. 2 according to an exemplary embodiment of the inventive concept.

FIG. 4 is a cross-sectional view illustrating a part of a pixel included in a display panel of FIG. 2 according to an exemplary embodiment of the inventive concept. Referring to FIG. 4, unlike FIG. 3, the conductive layer 115 may be disposed between the second substrate layer 113 and the buffer layer 140. Besides the above difference, descriptions with respect to FIG. 3 may be applied to FIG. 4.

Referring to FIGS. 3 and 4, the organic light emitting layer 132, as an example of an electro-optical active layer, may be formed on the transistor 120. Since the display panel 100 is an OLED display panel in the present exemplary embodiment, FIGS. 3 and 4 illustrate the organic light emitting layer 132 as an example of the electro-optical active layer. However, the inventive concept is not limited thereto, and as an example, when the display device 10 is an LCD device, a liquid crystal layer may be included as the electro-optic active layer.

An OLED 130 which includes the organic light emitting layer 132 is depicted in FIGS. 3 and 4. The OLED 130 includes a pixel electrode 131, the organic light emitting layer 132, and a common electrode 133. The pixel electrode 131 is formed on a part of a via layer 150 which is provided for insulation from the transistor 120. The pixel electrode 131 passes through the via layer 150 and contacts the drain electrode 125 of the transistor 120 to receive an electric signal from the transistor 120.

A pixel defining layer 134 may be formed on another portion of the via layer 150. The pixel defining layer 134 covers a part of an edge of the pixel electrode 131 to surround the periphery of the pixel electrode 131, as illustrated in FIGS. 3 and 4. However, the above descriptions are merely an example, and the pixel defining layer 134 may be formed parallel to the edge of the pixel electrode 131.

The organic light emitting layer 132 is formed on a part of the pixel electrode 131 that is not covered by the pixel defining layer 134. The organic light emitting layer 132 may emit light by an energy which is released when an exciton, which is formed by combination of holes and electrons provided from the pixel electrode 131 and the common electrode 133, changes its state from an excited state to a ground state.

The common electrode 133 is formed on the organic light emitting layer 132 to provide electrons to the organic light emitting layer 132.

Although the OLED 130 that includes the pixel electrode 131, the organic light emitting layer 132, and the common electrode 133 are depicted in FIGS. 3 and 4 according to exemplary embodiments of the inventive concept, the inventive concept is not limited thereto. Thus, as described above, electro-optic active layers used in various display panels, such as a plasma display panel as well as an LCD panel which includes a liquid crystal layer as an electro-optic active layer, may be formed.

Figure 5:
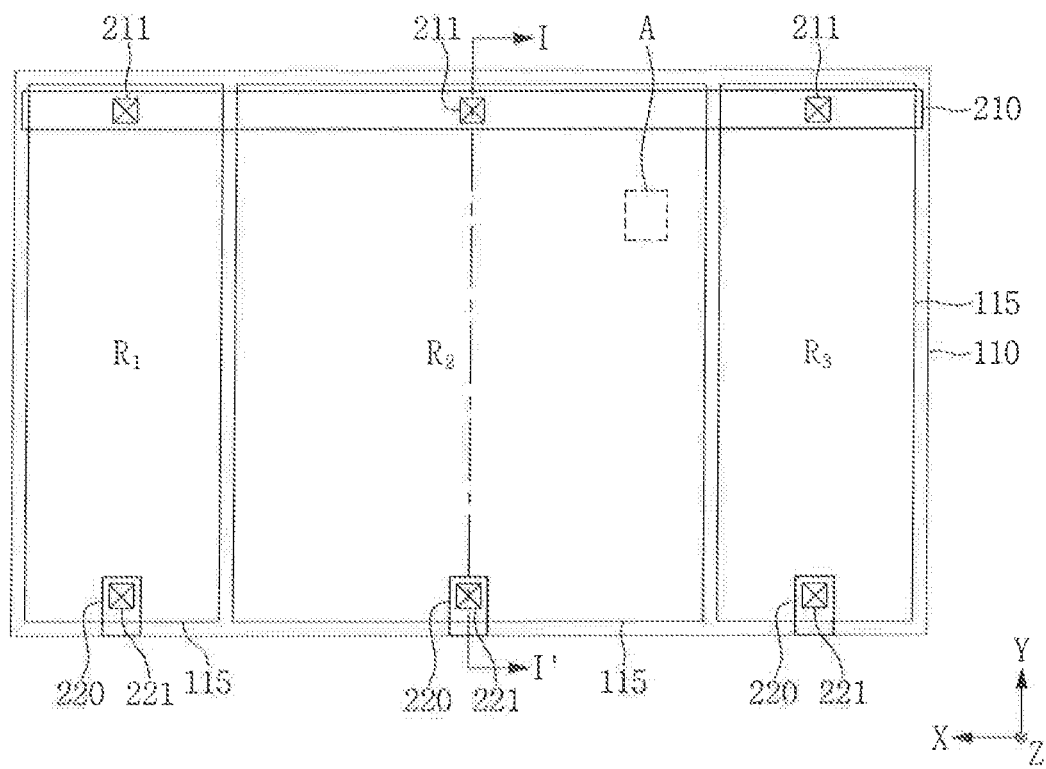
FIG. 5 is a plan view illustrating the display panel of FIG. 2 according to an exemplary embodiment of the inventive concept.
Figure 6:
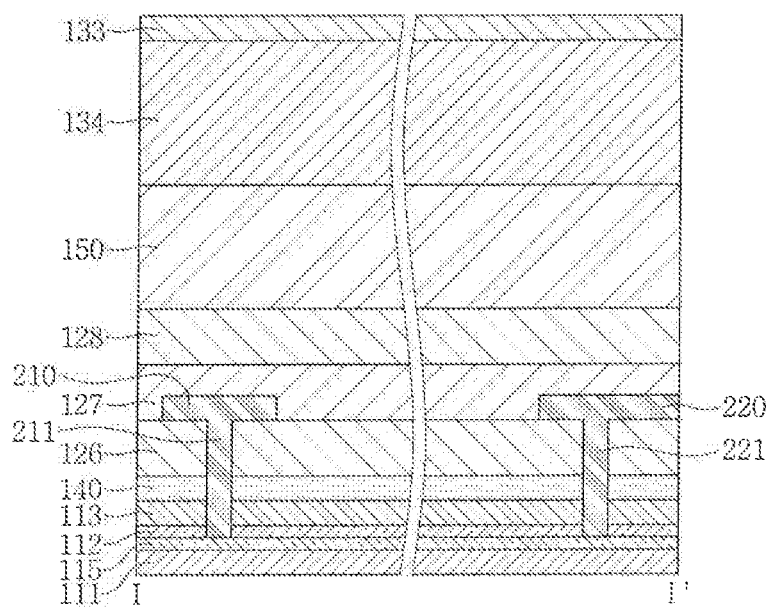
FIG. 6 is a cross-sectional view taken along line I-I' of FIG. 5 according to an exemplary embodiment of the inventive concept.

FIG. 5 is a plan view illustrating the display panel of FIG. 2, and FIG. 6 is a cross-sectional view taken along line I-I' of FIG. 5 according to an exemplary embodiment of the inventive concept. Elements other than the conductive layer 115, a ground electrode 210, a sensing electrode 220, and contact holes 211 and 221 are omitted. In addition, FIG. 6 shows a laminated structure of a non-display area in which pixels of the display panel 100 are not present, and a display area in which the pixels are disposed is omitted (see FIG. 3 and FIG. 4 for the laminated structure of the display area).

As illustrated in FIG. 5, the conductive layer 115 may be disposed over an entire surface of the substrate 110. In addition, the conductive layer 115 may be divided into the plurality of areas R1, R2, and R3, and may be separated into each area R1, R2, and R3. The conductive layer 115 of the areas R1, R2, and R3 are separated from one another. The plurality of areas R1, R2, and R3 are arranged in a first direction (an X-axis direction), and each of the areas R1, R2, and R3 extends in a second direction (a Y-axis direction) which is perpendicular to the first direction.

Referring to FIG. 5, the ground electrode 210 and the sensing electrode 220 may be disposed at an edge of the substrate 110, which is the non-display area. In the plan view, the ground electrode 210 and the sensing electrode 220 are each disposed at opposite ends in the second direction.

In addition, referring to FIG. 6, the ground electrode 210 is disposed on the second substrate layer 113, for example, on a layer substantially the same as a layer on which the first gate electrode 122 is disposed. However, the inventive concept is not limited thereto, and the ground electrode 210 may be disposed on a layer substantially the same as a layer on which the second gate electrode 123, the source electrode 124, the drain electrode 125, or the pixel electrode 131 are disposed. In addition, although the ground electrode 210 is depicted in FIG. 6 as being formed in the non-display area separately from other electrodes, the inventive concept is not limited thereto. The ground electrode 210 may be connected to or may be a part of the first gate electrode 122, the second gate electrode 123, the source electrode 124, the drain electrode 125, or the pixel electrode 131. The ground electrode 210 may be disposed in the display area.

A predetermined voltage may be applied to the ground electrode 210. For example, a ground voltage, a predetermined DC voltage, or an AC voltage having a predetermined frequency may be applied to the ground electrode 210. Hereinafter, it will be assumed that the ground voltage is applied to the ground electrode 210 for convenience of explanation.

As illustrated in FIG. 6, the conductive layer 115 contacts the ground electrode 210 which is formed on the first gate insulating layer 126 through the contact hole 211 which passes through the plurality of layers 112, 113, 140, and 126 in the non-display area to receive the ground voltage. Accordingly, the conductive layer 115 may serve as a discharge path for discharging external static electricity.

In addition, referring to FIG. 6, the sensing electrode 220 may be disposed on the second substrate layer 113, for example, on a layer substantially the same as a layer on which the first gate electrode 122 is disposed. However, the inventive concept is not limited thereto, and the sensing electrode 220 may be disposed on a layer different from the layer on which the first gate electrode 122 is disposed, for example, on a layer substantially the same as a layer on which the second gate electrode 123, the source electrode 124, the drain electrode 125, or the pixel electrode 131 is disposed.

The sensing electrode 220 is connected to a sensing power source for measuring a resistance of the conductive layer 115. The sensing power source may be included in the sensing portion 60 of FIG. 2. The sensing power source applies a sensing power to the sensing electrode 220. For example, the sensing power source applies a predetermined current signal to the sensing electrode 220, and the applied current signal flows along the sensing electrode 220, the contact hole 221, the conductive layer 115, the contact hole 211, and the ground electrode 210. Accordingly, the sensing electrode 220 outputs, to the sensing portion 60, a voltage signal which is determined according to the resistance of the conductive layer 115. The sensing portion 60 determines the resistance of the conductive layer 115 based on the applied current and the output voltage. Alternatively, the sensing power source may apply a predetermined voltage to the sensing electrode 220, and the sensing electrode 220 may output, to the sensing portion 60, a current which is determined according to the resistance of the conductive layer 115.

Each of the areas R1, R2, and R3 of the conductive layer 115 is connected to each sensing electrode 220, and a voltage that is determined according to a resistance of each of the areas R1, R2, and R3 is output to the sensing portion 60.

In an exemplary embodiment of the inventive concept, the display panel 100 may be bendable or foldable in the first direction. In addition, the display panel 100 may not be bendable in the second direction. In other words, with respect to FIG. 5, left and right sides are bent forward or backward (a Z-axis direction). In addition, a central area (R2) of the display panel 100 may be flat and only opposite side areas (R1 and R3) of the display panel 100 may be bendable or foldable.

In an exemplary embodiment of the inventive concept, stress is generated as the display panel 100 is bent or folded in the first direction. A stress generated at one point of the display panel 100 may be different from a stress generated at another point of the display panel 100. In other words, stresses generated at two points spaced apart from each other in the first direction may be different from each other. However, stresses generated at two points spaced apart from each other in the second direction, in which the display panel 100 is not bent, may be substantially equal to each other.

For example, the stresses in the left and right areas (R1 and R3) which are bent in the first direction may be different from the stress in the central area (R2) which is flat. In addition, the resistance of the conductive layer 115 may increase as the stress increases, for example, proportionately. Accordingly, the respective resistances of the conductive layers 115 in the areas R1, R2, and R3 become different from one another due to the respective stresses.

In an exemplary embodiment of the inventive concept, as the display panel 100 is bent or folded, the characteristics (e.g., a threshold voltage) of the transistor or the like in the display panel 100 may change, and accordingly, the luminance or the like of the display panel 100 may be affected. In addition, as described above, when the display panel 100 is partially bent, the characteristics of the transistor disposed in the bent portion (e.g., the areas R1 and R3) may change more than the transistor disposed in the area which is not bent (e.g., the area R2). Accordingly, a luminance deviation may arise in the display panel 100.

According to an exemplary embodiment of the inventive concept, the resistance of the conductive layer 115 may vary depending on the temperature of the display panel 100. In addition, the characteristics (e.g., a threshold voltage) of the transistor or the like in the display panel 100 may change depending on the temperature of the display panel 100, and accordingly, the luminance or the like of the display panel 100 is affected. In addition, as described above, when the display panel 100 has a partial temperature deviation, for example, when the areas R1 and R3 have temperatures higher than that of the area R2, the characteristics of the transistor disposed in the areas R1 and R3 may change more than the transistor disposed in the area R2. Accordingly, a luminance deviation may arise in the display panel 100.

In an exemplary embodiment of the inventive concept, the characteristic variation of the transistor, e.g., the luminance variation of the display panel 100, may be predicted based on the measured resistance variation of the conductive layer 115. In an exemplary embodiment of the inventive concept, the relationship between the resistance variation of the conductive layer 115 and the characteristic variation of the transistor may vary depending on the material and structure of the conductive layer, the type of the transistor, the structure of the display panel, or the like. Accordingly, the relationship between the resistance variation of the conductive layer 115 and the characteristic variation of the transistor may be determined by experiments on a specific display panel.

For example, when the resistance of the conductive layer 115 varies depending on the stress of the display panel 100, such a relationship may be identified by bending the display panel 100 in various ways, for example, changing an angle, a radius of curvature, or the like of the display panel 100, and measuring the resistance variation of the conductive layer 115 and the characteristic variation of the transistor in each case. In addition, when the resistance of the conductive layer 115 varies depending on the temperature of the display panel 100, such a relationship may be identified by varying the temperature of the display panel 100 and measuring the resistance variation of the conductive layer 115 and the characteristic variation of the transistor in each case.

The memory 80 may store the experimentally measured resistance variation and the corresponding characteristic variation of the transistor in the form of a table (hereinafter, a look-up table). However, the inventive concept is not limited thereto. For example, when a specific relationship which may be expressed by a function such as a direct proportion can be established between the measured resistance variation and the corresponding characteristic variation of the transistor, the functional formula may be stored in the memory. Alternatively, a circuit corresponding to the function may be implemented without a memory.

FIGS. 7a to 7f are views enlarging patterns of a section A of a conductive layer of FIG. 5 according to exemplary embodiments of the inventive concept.

Figure 7A:
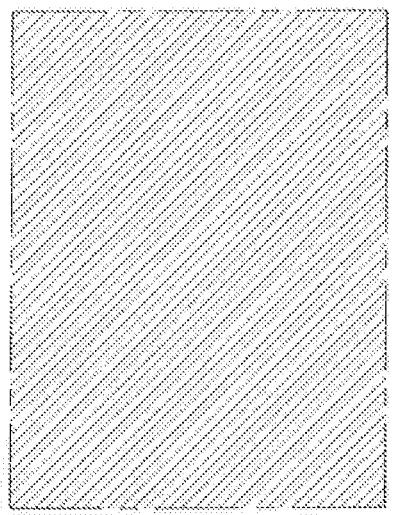
FIGS. 7a to 7f are views enlarging patterns of a section A of a conductive layer of FIG. 5 according to exemplary embodiments of the inventive concept.

As illustrated in FIG. 7a, the conductive layer 115 according to an exemplary embodiment of the inventive concept has a plate shape. In addition, each of the conductive layers 115 of the plurality of areas R1, R2, and R3 is in the form of a quadrangular plate, and is separated from one another between the areas R1, R2, and R3.

Figure 7B:
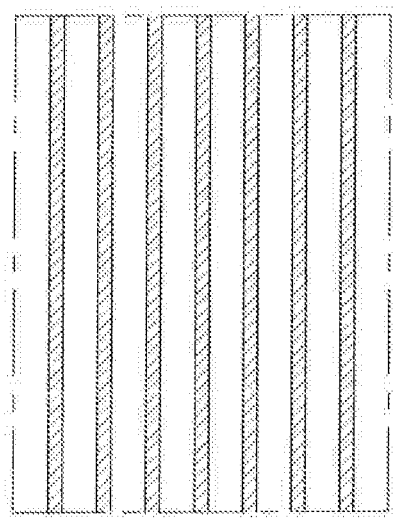
Figure 7C:
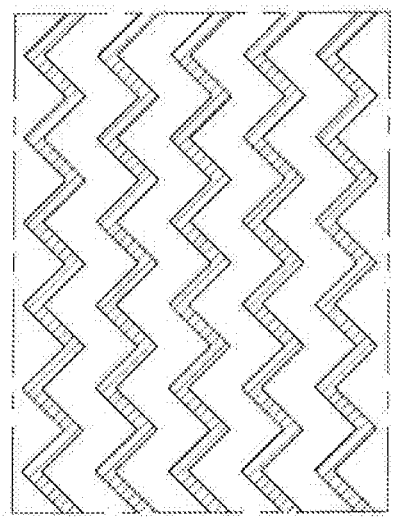
Figure 7D:
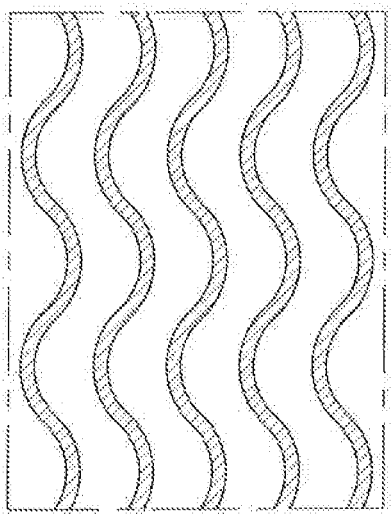

As illustrated in FIGS. 7b, 7c, and 7d, the conductive layer 115 according to exemplary embodiments of the inventive concept has a pattern in which a plurality of lines are arranged parallel to one another. For example, the plurality of lines are arranged in the first direction, and each line extends in the second direction. The plurality of lines may be connected to one another at the end of the second direction. In addition, each of the conductive layers 115 of the plurality of areas R1, R2, and R3 has a plurality of line patterns parallel to one another, and the conductive layers 115 are not connected to one another between the areas R1, R2, and R3.

The lines of the pattern may have various shapes. FIG. 7b shows a pattern of straight lines, FIG. 7c shows a pattern of straight lines that are bent in a zigzag manner, and FIG. 7d shows a pattern of spring-shaped curved lines.

Figure 7E:
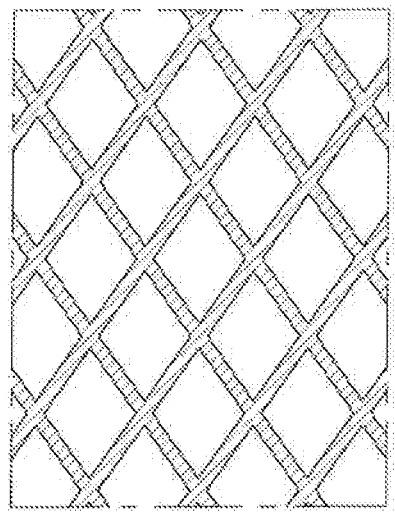
Figure 7F:
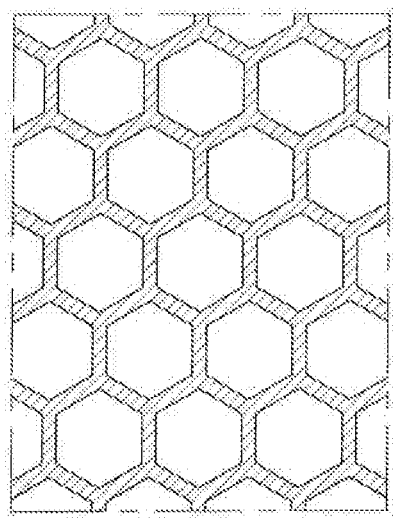

As illustrated in FIGS. 7e and 7f, the conductive layer 115 according to exemplary embodiments of the inventive concept has a pattern in which a plurality of lines cross one another.

As illustrated in FIG. 7e, the conductive layer 115 has a mesh-like pattern. In other words, a plurality of lines arranged parallelly in a third direction and a plurality of lines arranged parallelly in a fourth direction cross one another. In FIG. 7f, the conductive layer 115 has a honeycomb-like pattern. Likewise, each of the conductive layers 115 of the plurality of areas R1, R2, and R3 has a mesh-like or honeycomb-like pattern, and the conductive layers 15 are separated from one another between the areas R1, R2, and R3.

Figure 8:
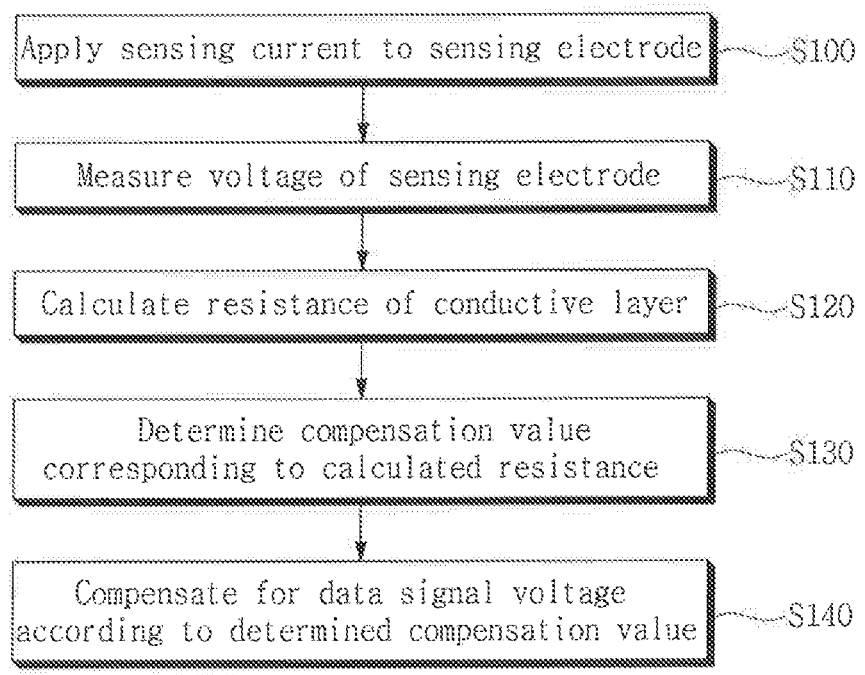
FIG. 8 is a flowchart showing a compensation method according to an exemplary embodiment of the inventive concept.

FIG. 8 is a flowchart showing a compensation method according to an exemplary embodiment of the inventive concept.

First, the sensing portion 60 applies a sensing current to the sensing electrode 220 of each of the areas R1, R2, and R3 according to a control signal of the timing controller 40 (S100). As described above, the sensing portion 60 includes the sensing power source, and the sensing power source applies a predetermined voltage or current to the sensing electrode 220. Hereinafter, it is assumed that the sensing power source applies a predetermined current (sensing current) for convenience of explanation. The applied sensing current flows along the sensing electrode 220, the contact hole 221, the conductive layer 115, the contact hole 211, and the ground electrode 210. Accordingly, a voltage which is determined according to a resistance of the conductive layer 115 is output from the sensing electrode 220.

The sensing portion 60 measures a voltage output from the sensing electrode 220 of each of the areas R1, R2, and R3 (S110).

The sensing portion 60 calculates the resistance of the conductive layer 115 based on the applied sensing current and the output voltage (S120).

As described above, when a predetermined sensing voltage is applied from the sensing power source to the sensing electrode 220, the resistance value of the conductive layer 115 may be determined based on the sensing voltage applied to the sensing electrode 220 and a current output from the sensing electrode 220. The sensing portion 60 provides the determined resistance value to the compensating portion 70. In an exemplary embodiment of the inventive concept, the sensing portion 60 may provide the voltage output from the sensing electrode 220 of each of the areas R1, R2 and R3 to the compensating portion 70 without determining the resistance value.

The compensating portion 70 determines a compensation value corresponding to each resistance value (or measured voltage value) of each of the areas R1, R2, and R3 by referring to the look-up table stored in the memory 80 (S130).

As described above, the memory 80 may store a look-up table including an experimentally measured resistance variation (a difference between the reference resistance value and the measured resistance value) and a characteristic variation of the transistor corresponding thereto. Accordingly, the compensating portion 70 reads the characteristic variation corresponding to each resistance value calculated by referring to the look-up table, and determines each compensation value based on the characteristic variation.

The compensation value may be a value for compensating for the high potential driving voltage VDD and the low potential driving voltage VSS applied from the power supply portion 50, the data signal voltage output from the data driver 30, and the image data R', G', and B' output from the timing controller 40. In other words, the compensation value may be a value of at least one of the high potential driving voltage VDD, the low potential driving voltage VSS, the data signal voltage, and the image data R', G', and B' that needs to be compensated so as to maintain the luminance of each area R1, R2, and R3 of the display panel 100, although the characteristics of the transistor change due to the stress or temperature change in the display panel 100.

In an exemplary embodiment of the inventive concept, the memory 80 stores the look-up table including compensation values corresponding to the measured resistance values, and the compensating portion 70 may output the compensation value corresponding to the calculated resistance value with reference to the look-up table stored in the memory 80. Similar to the relationship between the resistance variation and the characteristic variation of the transistor, the relationship between the resistance value and the compensation value may be determined experimentally.

The case where the compensation value is a value for the data signal voltage will be described by way of example. The stress or temperature of the display panel 100 is changed, and the resistance of the conductive layer 115 is measured. Then, the data signal voltage is compensated so that the display panel 100 may maintain a substantially same luminance at the changed stress or temperature. The difference (e.g., the resistance variation) between the reference resistance and the resistance measured at various stresses or temperatures and the difference (e.g., the compensation value) between the correspondingly compensated data signal voltage and the data signal voltage before the compensation may define the look-up table.

However, the inventive concept is not limited thereto, and when a specific relationship which may be expressed by a function such as a direct proportion can be established between the measured resistance variation and the corresponding compensation value, the functional formula may be stored in the memory. Alternatively, a circuit corresponding to the function may be implemented without a memory.

The compensating portion 70 provides the determined compensation value for each of the areas R1, R2 and R3 to the data driver 30, the timing controller 40, or the power supply portion 50. When the compensation value is related to the data signal voltage, the compensating portion 70 provides the compensation value to the data driver 30. When the compensation value is related to the image data R', G', and B', the compensating portion 70 provides the compensation value to the timing controller 40. In addition, when the compensation value is related to the high potential driving voltage VDD or the low potential driving voltage VSS, the compensating portion 70 provides the compensation value to the power supply portion 50.

The data driver 30 that has received the compensation value compensates for respective data signal voltages for pixels located in the areas R1, R2 and R3 according to the compensation values thereof (S140). When the timing controller 40 or the power supply portion 50 receives the compensation value, the high potential driving voltage VDD, the low potential driving voltage VSS, or the image data R', G', and B' may be compensated according to the compensation value.

As set forth hereinabove, a display device according to exemplary embodiments of the inventive concept may discharge static electricity generated on a substrate and may sense the stress or temperature of the substrate.

In addition, a display device according to exemplary embodiments of the inventive concept may maintain uniform display characteristics despite changes in the stress or temperature of the substrate.

Furthermore, a display device according to exemplary embodiments of the inventive concept may maintain uniform display characteristics although the stress or temperature of the substrate differs depending on the position thereof.

While the inventive concept has been illustrated and described with reference to exemplary embodiments thereof, it will be apparent to those of ordinary skill in the art that various changes in form and detail may be made thereto without departing from the spirit and scope of the inventive concept as set forth by the following claims.

What is claimed is:
1. A display device comprising:
    a substrate comprising a first substrate layer which is flexible, a second substrate layer which is flexible, and a conductive layer between the first substrate layer and the second substrate layer;
    a display panel comprising a plurality of transistors disposed on the substrate; and
    a sensing portion including a power source that provides to the conductive layer one of a predetermined voltage signal and a predetermined current signal and is configured to measure a resistance of the conductive layer based on one of a voltage signal and a current signal received from the conductive layer.
2. The display device of claim 1, wherein the display panel further comprises a barrier layer disposed between the first substrate layer and the second substrate layer.
3. The display device of claim 1, wherein the conductive layer has one of a parallel straight line pattern, a mesh-like pattern, a honeycomb-like pattern, a spring-like pattern, or a zigzag pattern.
4. The display device of claim 1, wherein the conductive layer has a plurality of areas separated from one another, and
    the sensing portion measures a resistance of each of the plurality of areas.
5. The display device of claim 4, wherein the substrate is bendable in a first direction,
    the plurality of areas are arranged in the first direction, and
    each of the plurality of areas extends in a second direction which is perpendicular to the first direction.
6. The display device of claim 5, wherein the plurality of areas comprise at least three areas.
7. The display device of claim 6, further comprising a ground electrode disposed on the substrate and configured to receive a ground voltage,
    wherein the conductive layer is connected to the ground electrode through a first contact hole which passes through the second substrate layer.
8. The display device of claim 7, further comprising a sensing electrode disposed on the substrate, configured to receive from the power source a sensing power, and connected to the sensing portion,
    wherein the conductive layer is connected to the sensing electrode through a second contact hole which passes through the second substrate layer.
9. The display device of claim 8, wherein the first contact hole and the second contact hole are located at respective side edges of the display panel opposite to each other in the second direction.

10. The display device of claim 4, further comprising;
a data driver configured to apply data signal voltages to pixels disposed in the display panel and overlapping the plurality of areas; and
a compensating portion including a circuit that determines one or more compensation values and is configured to compensate for the data signal voltages applied to the pixels based on the resistances of the plurality of areas measured by the sensing portion and the one or more compensation values.

11. The display device of claim 1, further comprising;
a data driver configured to apply a data signal voltage to pixels disposed in the display panel; and
a compensating portion including a circuit that determines one or more compensation values and is configured to compensate for the data signal voltage based on a resistance of the conductive layer measured by the sensing portion and the one or more compensation values.

12. The display device of claim 1, further comprising;
a power supply configured to apply a power voltage to pixels disposed in the display panel; and
a compensating portion including a circuit that determines one or more compensation values and is configured to compensate for the power voltage based on a resistance of the conductive layer measured by the sensing portion and the one or more compensation values.

13. The display device of claim 1, wherein the conductive layer has a variable resistance which varies in accordance with deformation of the substrate.

14. The display device of claim 1, wherein the conductive layer has a variable resistance which varies depending on a temperature of the substrate.

15. A display device comprising:
a substrate comprising a first substrate layer which is flexible, a buffer layer, and a conductive layer between the first substrate layer and the buffer layer;
a display panel comprising a plurality of transistors disposed on the buffer layer; and
a sensing portion including a power source that provides to the conductive layer one of a predetermined voltage signal and a predetermined current signal and is configured to measure a variation of a resistance of the conductive layer based on one of a voltage signal and a current signal received from the conductive layer.

16. The display device of claim 15, wherein the substrate further comprises:
a barrier layer disposed between the first substrate layer and the buffer layer; and
a second substrate layer disposed between the barrier layer and the buffer layer.

17. A display device comprising:
a first substrate which is flexible;
a second substrate which is flexible;
a conductive layer between the first substrate and the second substrate;
a plurality of transistors on the second substrate; and
a sensing electrode connected to the conductive layer, and configured to receive one of a predetermined voltage signal and a predetermined current signal and output one of a voltage signal and a current signal which are determined based on a resistance of the conductive layer.

18. The display device of claim 17, further comprising a ground electrode disposed on the second substrate, connected to the conductive layer, and configured to receive a ground voltage.

19. The display device of claim 18, wherein the sensing electrode and the ground electrode are disposed on the second substrate and are connected to the conductive layer through a contact hole which passes through the second substrate.

20. The display device of claim 17, wherein the conductive layer has one of a parallel straight line pattern, a mesh-like pattern, a honeycomb-like pattern, a spring-like pattern, or a zigzag pattern.

* * * * *